(12) United States Patent
Mahanpour

(10) Patent No.: US 6,452,234 B1
(45) Date of Patent: Sep. 17, 2002

(54) HOW TO IMPROVE THE ESD ON SOI DEVICES

(75) Inventor: Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/722,222

(22) Filed: Nov. 27, 2000

(51) Int. Cl.[7] ............................................... H01L 27/01
(52) U.S. Cl. ........................ 257/349; 257/350; 257/351; 257/357
(58) Field of Search .................................. 257/357, 349, 257/350, 351

(56) References Cited

U.S. PATENT DOCUMENTS

| | | | | |
|---|---|---|---|---|
| 4,902,637 A | * | 2/1990 | Kondou et al. | 437/51 |
| 4,989,057 A | * | 1/1991 | Lu | 357/23.7 |
| 5,486,716 A | * | 1/1996 | Saito et al. | 257/360 |
| 5,923,067 A | * | 7/1999 | Voldman | 257/349 |
| 6,034,397 A | * | 3/2000 | Voldman | 257/335 |
| 6,121,659 A | * | 9/2000 | Christensen et al. | 257/347 |

* cited by examiner

Primary Examiner—Richard Elms
Assistant Examiner—Douglas Menz
(74) Attorney, Agent, or Firm—Davis Chin

(57) ABSTRACT

A protection circuit structure for use with silicon-on-insulator integrated circuits is provided so as to improve electrostatic discharge protection capability. The protection circuit structure includes a P/N junction defining a protection diode. The protection diode is formed underneath an electrically conductive input pad associated with a conventional SOI semiconductor device.

6 Claims, 1 Drawing Sheet

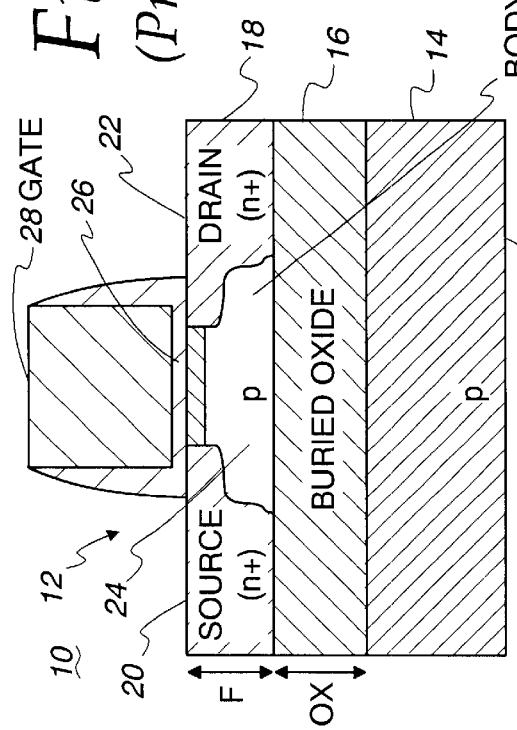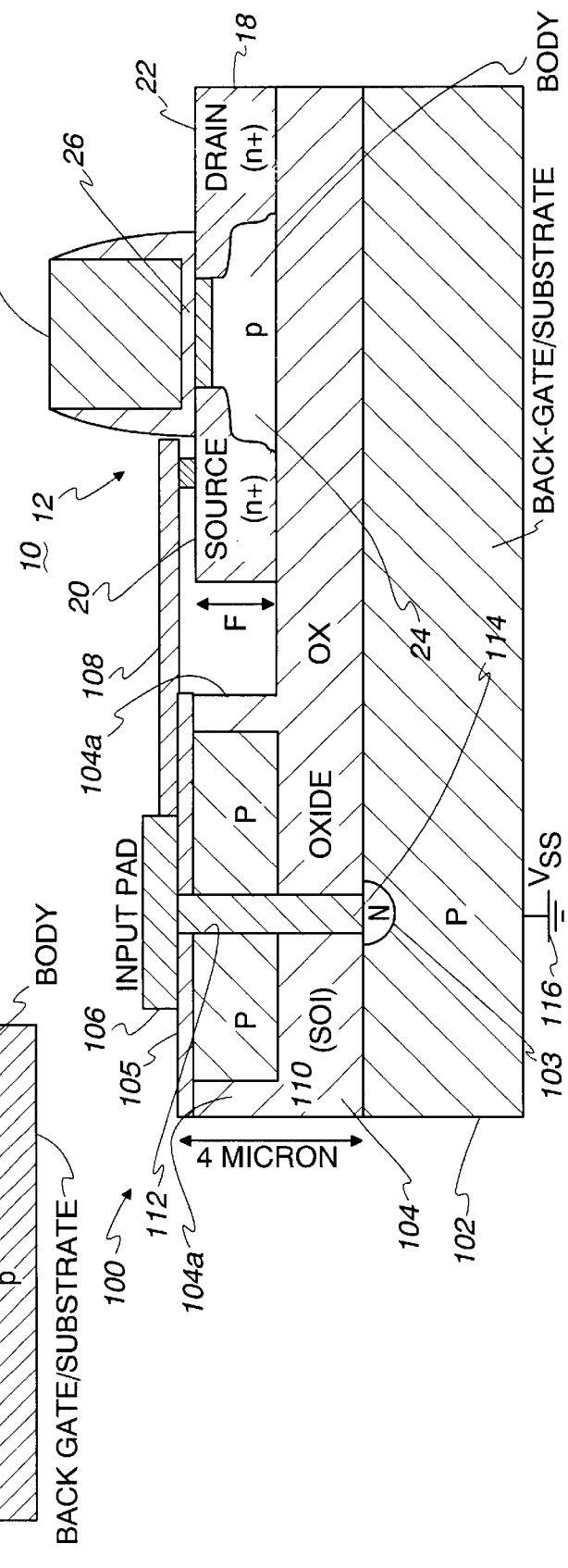

HOW TO IMPROVE THE ESD ON SOI DEVICES

BACKGROUND OF THE INVENTION

This invention relates generally to electrostatic discharge (ESD) protection circuits for silicon-on-insulator (SOI) circuits. More particularly, it relates to a novel protection circuit structure for providing improved electrostatic discharge protection capability to silicon-on-insulator circuits.

As is generally well-known in the art, silicon-on-insulator (SOI) technology has become considered as one of the most effective techniques for fabricating high-speed MOS and CMOS circuits in very large scale integrated (VLSI) circuits. In accordance with the SOI technique, a thin epitaxial layer of semiconductor material, such as silicon, is deposited on an insulator (e.g., a buried oxide film) so as to reduce the capacitive coupling between the semiconductor layer and the underlying insulator and substrate material and thus preventing latch-up. Therefore, field-effect transistors and other devices formed within the thin epitaxial layer of semiconductor material have an advantage of high-speed switching characteristics than the integrated circuits of the same dimension fabricated on a traditional bulk silicon substrate.

However, these SOI circuits, like other MOS-type circuits, are particularly susceptible to being damaged or even destroyed by electrostatic discharge. In particular, the magnitude of an electric voltage allowed to be applied to the thin gate insulators of the MOS and CMOS transistors is rather limited since their physical size thereof is fairly small. Thus, such static discharge by persons or equipment handling the integrated circuits can be of a catastrophic nature with sufficient energy so as to cause permanent damage of the semiconductor elements therein.

In order to protect the semiconductor elements formed in the bulk silicon substrate from electrostatic discharge, ancillary protection circuits were provided and the energy would be dissipated through the bulk silicon substrate on which the circuits were fabricated. On the other hand, the ancillary protection circuits, such as diode circuits, in the bulk substrate do not perform well in the SOI circuits. This is due to the fact that the insulating layer (buried film oxide) in the SOI circuits is a poor thermal conductor and thus all of the energy must be dissipated laterally through the diodes formed in the thin semiconductor layer. As a result, this leads to increased heat being generated during the ESD event since the buried oxide film has inferior thermal conducting characteristics as compared to the bulk silicon.

Accordingly, there still exists a need for a protection circuit structure for use with silicon-on-insulator circuits so as to provide enhanced electrostatic discharge protection. Further, it would be desirable for the protection circuit structure to readily serve as a heat sink so as to dissipate the thermal energy created in the thin semiconductor layer of the SOI structure.

SUMMARY OF THE INVENTION

Accordingly, it is a general object of the present invention to provide a novel protection circuit structure for use with silicon-on-insulator circuits which has traditionally been unavailable heretofore.

It is an object of the present invention to provide a protection circuit structure for providing improved electrostatic discharge protection capability to silicon-on-insulator circuits.

It is another object of the present invention to provide a protection circuit structure for use with silicon-on-insulator circuits which can serve as a heat sink so as to dissipate the thermal energy during an ESD event.

It is still another object of the present invention to provide a protection circuit structure for use with silicon-on-insulator circuits which includes a protection diode formed underneath an electrically conductive input or input/output pad.

In a preferred embodiment of the present invention, there is provided a protection circuit structure for providing electrostatic discharge protection capability to silicon-on-insulator integrated circuits. A SOI structure includes a transistor device having a source region, a drain region, and a channel region all formed over an insulating layer. The insulating layer is formed over a p-type silicon substrate. A thin oxide layer is formed over the insulating layer. A p-type conductive region is formed in an upper portion of the insulating layer. A metal conductive region is formed in the center of the p-type conductive region and extends between top and bottom surfaces thereof. An n-type conductive region is formed in the p-type silicon substrate adjacent to the bottom surface of the p-type conductive region so as to define a protection diode with the p-type silicon substrate. An electrically conductive input or input/output pad is formed over the top surface of the n-type conductive region. A conductive lead line is operatively joined between the input or input/output pad and one of the source and drain regions of the transistor device.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is an enlarged, cross-sectional view of a conventional SOI semiconductor integrated circuit device formed with an ESD transistor; and FIG. 2 is an enlarged, cross-sectional view of a protection circuit structure, constructed in accordance with the principles of the present invention, for use with the SOI semiconductor device of FIG. 1.

DESCRIPTION OF THE PREFERRED EMBODIMENT

Referring now in detail to the drawings, there is shown in FIG. 1 a cross-sectional view of a conventional silicon-on-insulator (SOI) semiconductor integrated circuit device 10 formed with an ESD n-channel MOS transistor 12. The SOI semiconductor device 10 includes a silicon substrate 14, an insulating or buried oxide layer 16 formed on top of the silicon substrate 14, and a thin semiconductor layer 18 formed over the insulating layer 16. While not drawn to scale, the silicon substrate 14 has a thickness which is substantially larger than the insulating layer 16 or the thin semiconductor layer 18. The insulating layer 16 is typically formed of silicon dioxide ($SiO_2$) and has a thickness on the order of 0.5 microns. The thin semiconductor layer 18 defines the material in which the ESD transistor 12 is formed and has a thickness on the order of about 0.3–1.0 microns.

The ESD transistor 12 includes a heavily n+ doped source region 20, a heavily n+ doped drain region 22, and a lightly doped p-type conduction channel region or body 24 all formed in the thin semiconductor layer 18 which overlies the insulating layer 16. The regions 20, 22 and 24 are fabricated in a conventional manner by appropriate masking, patterning and doping of the thin semiconductor layer 18 as is well known to those skilled in the art. Further, the ESD transistor 12 includes a thin gate oxide 26 formed over the thin semiconductor layer 18. A doped polysilicon gate electrode 28 is formed on top of the gate oxide 26. Electrical conductive leads (not shown) are operatively connected to the source region 20, drain region 22, and gate electrode 28 which are used for connection to other circuit elements.

As can be seen, the insulating or buried oxide layer 16 serves to electrically isolate the thin semiconductor layer 18 from the silicon substrate 14 so as to reduce the capacitive coupling therebetween. Consequently, the speed of the transistor device 12 formed in the thin semiconductor layer 18 is increased. However, as was previously pointed out, the insulating layer 16 exhibits poor thermal characteristics. Furthermore, this is coupled with the fact that no parasitic P/N junctions exist in the ESD transistor 12, as in devices fabricated in the bulk silicon. Thus, heat generated within the thin semiconductor layer 18 will not be coupled to the silicon substrate 14. As a result, the thermal energy generated by the ESD transistor 12 must be dissipated within such thin semiconductor layer 18, which creates the problem of preventing adequate ESD protection for the SOI devices.

In particular, it will be noted that the ESD transistor 12 has lateral P/N junctions which are formed between adjacent regions (regions 24/20 and 24/18) in the thin semiconductor layer 18. These lateral P/N junctions are very small in area and cannot conduct very large amounts of current. This disadvantage has caused the lack of adequate ESD protection for the SOI devices.

In order to improve ESD protection for SOI devices, the inventor of the instant invention has developed a way of building a protection circuit structure underlying an input or input/output (I/O) pad associated with the conventional ESD transistor 12 of FIG. 1. As can be seen from FIG. 2, there is illustrated an enlarged, cross-sectional view of a protection circuit structure 100, constructed in accordance with the principles of the present invention, for use with the SOI semiconductor device 10 of FIG. 1. The protection circuit structure 100 includes a p-type silicon substrate 102, and an insulating layer or buried oxide layer 104, which are formed underneath a thin oxide layer 105 and an input pad or input/output (I/O) pad 106 associated with the conventional SOI semiconductor device 10. In particular, the input pad 106 is formed on top of the thin oxide layer 105 and is joined by a metal conductive lead line 108 for making electrical connection to the source region 20 of the transistor device 12.

Further, the protection circuit structure 100 includes a p-type conductive region 110 formed in an upper portion of the insulating or buried oxide layer 104. It will be noted that vertical portions 104a of the buried oxide layer surround the outer sides of the p-type region 110 so as to electrically isolate the same from other circuit elements on the chip. A vertical opening 112 is formed in the center of the thin oxide layer 105 and the buried oxide layer 104 down to the top surface of the silicon substrate 102. The exposed portion of the silicon substrate 102 adjacent to the bottom surface of the buried oxide layer 104 is doped with an n-type conductive material 103 through the vertical opening 112 so as to create a protection diode (P/N junction) with the p-type silicon substrate 102. The vertical opening 112 is filled with a metal conductive region 114 extending vertically between the input pad 106 and the n-type conductive material 103 adjacent to the silicon substrate 102 so as to create a connection therebetween. Typically, the silicon substrate 102 is also connected to a VSS power supply terminal 116.

In operation, if the ESD event applies a high positive voltage to the VSS power supply terminal 116 (with respect to the voltage applied to the input pad 106), an electrically conductive path is formed between the VSS power supply terminal 116 and the input pad 106 via the large P/N junction defining the protection diode (102, 103) which is forward biased. As a result, a high current will flow through the protection diode so as to prevent damage to integrated circuitry (not shown) and the ESD transistor 12 that are to be protected which are coupled also to the input pad 106.

On the other hand, if the ESD event applies a high positive voltage to the input pad 106 (with respect to the voltage applied to the VSS power supply terminal 116), current will flow from the n-type conductive region 103 through the p-type substrate 102 to the VSS power supply terminal 116. In this manner, the large P/N junction forming the protection diode will be operated in a reverse breakdown mode so as to protect again the integrated circuitry coupled and the ESD transistor 12 to the input pad.

Further, it will be noted that the substrate 102 serves as a heat sink so as to dissipate the heat generated around the input pad 106 and the source region 20 during the ESD event. In addition, the process of fabricating the protection circuit structure 100 (e.g., protection diode) is relatively simple and can be easily integrated into the existing semiconductor processes.

From the foregoing detailed description, it can thus be seen that the present invention provides a novel protection circuit structure for providing improved electrostatic discharge protection capability to silicon-on-insulator circuits. The protection circuit structure includes a P/N junction forming a protection diode which is disposed underneath an input pad associated with the conventional SOI semiconductor device.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A protection circuit structure for providing electrostatic discharge protection capability to silicon-on-insulator integrated circuits, said protection circuit structure comprising in combination:

a SOI structure including a transistor device including a source region, a drain region and a channel region all formed in a thin oxide layer overlying an insulating layer;

said insulating layer being formed over a p-type silicon substrate;

said thin oxide layer being formed over said insulating layer;

a p-type conductive region being formed in an upper portion of said insulating layer;

said p-type conductive region being spaced laterally apart from said SOI structure so that portions of said insulating layer surround the outer sides of said p-type conductive region to provide electrical isolation;

a metal conductive region being formed in the center of said p-type conductive region and extending between the top surface of said thin oxide layer and the bottom surface of said insulating layer;

an n-type conductive region being formed in said p-type silicon substrate adjacent to the bottom surface of said metal conductive region so as to define a protection diode with said p-type silicon substrate;

an electrically conductive input or input/output (I/O) pad formed over the top surface of said thin oxide layer; and a conductive lead being operatively joined between said input pad and one of said source and drain regions of the transistor device.

2. A protection circuit structure as claimed in claim 1, further comprising a VSS power supply terminal connected to said silicon substrate.

3. A protection circuit structure as claimed in claim 2, wherein when an ESD event applies a high negative voltage to the input pad relative to the VSS power supply terminal, an electrically conductive path is formed through the protection diode which is forward biased.

4. A protection circuit structure as claimed in claim 2, wherein when an ESD event applies a high positive voltage to the input pad relative to the VSS power supply terminal, current will flow through the protection diode which is operated in a reverse breakdown mode.

5. A protection circuit structure as claimed in claim 2, wherein said silicon substrate serves as a heat sink so as to dissipate thermal energy created during an ESD event and normal operation.

6. A protection circuit structure as claimed in claim 1, wherein said insulating layer is formed of silicon dioxide.

* * * * *